US006501317B2

(12) United States Patent
Lin et al.

(10) Patent No.: US 6,501,317 B2
(45) Date of Patent: Dec. 31, 2002

(54) HIGH SPEED, LOW-POWER CMOS CIRCUIT WITH CONSTANT OUTPUT SWING AND VARIABLE TIME DELAY FOR A VOLTAGE CONTROLLED OSCILLATOR

(75) Inventors: Xijian Lin, Fremont, CA (US); Barry Harvey, Los Altos, CA (US); Alexander Fairgrieve, Menlo Park, CA (US)

(73) Assignee: Elantec Semiconductor, Inc., Milpitas, CA (US)

( * ) Notice: Subject to any disclaimer, the term of this patent is extended or adjusted under 35 U.S.C. 154(b) by 0 days.

(21) Appl. No.: 09/828,398

(22) Filed: Apr. 6, 2001

(65) Prior Publication Data

US 2002/0145460 A1 Oct. 10, 2002

(51) Int. Cl.$^7$ ................................ H03K 5/22
(52) U.S. Cl. ................ 327/287; 327/65; 327/266; 327/280; 327/274; 327/309; 327/318; 327/327
(58) Field of Search ............... 327/280, 287, 327/266, 274, 309, 318, 327, 65; 331/57, 108 R

(56) References Cited

U.S. PATENT DOCUMENTS 5,994,939 A * 11/1999 Johnson et al. ............. 327/280
6,052,003 A * 4/2000 Molin et al. ................. 327/112
6,304,150 B1 * 10/2001 Shenoy ......................... 331/57

OTHER PUBLICATIONS

John G. Maneatis, Low–Jitter Process–Independent DLL and PLL Based on Self–Biased Techniques, IEEE Journal of Solid State Circuits, vol. 31, No. 11, Nov. 1996, pp. 1723–1732.

* cited by examiner

Primary Examiner—Margaret R. Wambach
(74) Attorney, Agent, or Firm—Fliesler, Dubb, Meyer & Lovejoy, LLP

(57) ABSTRACT

A delay circuit is provided for use in a ring oscillator of a phase locked loop (PLL). The delay circuit includes a differential pair of NMOS transistors 102 and 103 with an NMOS transistor 101 providing the tail current for the differential pair. Complementary NMOS and PMOS load transistors 104,106 and 105, 107 provide loads for the differential transistor 102 and 103. Transistors 111–114 and 121–122 together with an amplifier 130 provide biasing for the delay device. The amplifier 130 has a non-inverting input set to $V_{DD}-V_{CLAMP}$. As configured, a constant output voltage swing from $V_{DD}$ to $V_{DD}-V_{CLAMP}$ is provided at the outputs $V_{OUT}+$ and $V_{OUT}-$ of the delay device, independent of a control voltage $V_{CTL}$ used to set the tail current. The NMOS load transistor 104, as opposed to the PMOS transistor 4 in FIG. 1, does not contribute to the gate parasitic capacitance enabling a high operation speed without consumption of more supply current. A wide frequency tuning range of a ring oscillator using the delay circuit of FIG. 2 is provided because the operating frequency for a ring oscillator will be directly proportional to the tail current through transistor 101.

8 Claims, 2 Drawing Sheets

HIGH SPEED, LOW-POWER CMOS CIRCUIT WITH CONSTANT OUTPUT SWING AND VARIABLE TIME DELAY FOR A VOLTAGE CONTROLLED OSCILLATOR

BACKGROUND OF THE INVENTION

1. Field of the Invention

The present invention relates to delay circuits for use in a ring oscillator of a phase locked loop.

2. Background

Phase-Locked loops (PLL) are used in a number of applications, including communications, digital circuits and mass storage electronics. A number of designs for PLLs are known to a person of ordinary skill in the art. The conventional PLL designs include a voltage or current controlled oscillator (VCO or ICO), a critical part in determining the performance of the PLL. Important parameters of a VCO or ICO for a PLL include: (1) Tuning range, or the range between the minimum and maximum values of the VCO frequency with minimal variation of the output amplitude and low jitter; (2) Supply and substrate noise rejection; and (3) Power consumption.

FIG. 1 shows a conventional delay circuit which can be used in a ring oscillator of a VCO or ICO of a PLL. The delay circuit of FIG. 1 is disclosed in IEEE JSSC, Vol. 31, No. 11, November 1996, pp. 1723–1732. Transistors 1–7 form a delay stage and transistors 11 and 12 provide the biasing for the delay circuit.

The delay stage contains a source-coupled pair of transistors 2 and 3 with resistive loads 4–7. The loads each include a diode-connected PMOS device 4 or 5 in shunt with an equally sized biased PMOS device 6 or 7. Transistors 4–7 are PMOS devices as illustrated by the circle provided on their gate, while transistors such as 2 and 3 without such a gate circle are NMOS devices. The gate circles are used to show which transistors are PMOS and NMOS devices in FIG. 1, as well as in subsequent figures.

For proper bias, the sizes of transistors 11, 12, 6 and 7 are chosen so that when, for example transistor 2 is fully on, transistor 6 draws ½ the current of transistor 1. Likewise, if transistor 3 is fully on, then transistor 7 draws ½ the current of transistor 1.

The delay circuit of FIG. 1 has an output voltage swing from $V_{DD}$ to $V_{DD}-V_{GS}$. Here, $V_{GS}$ is a gate-source voltage equal to $V_T+\sqrt{2*I_D/k}$, where k is the device transconductance of one of conducting load transistors 4 or 5. $I_D$ is the drain current of one of transistors 4 or 5, which is typically half of the tail current through transistor 1, as controlled by the time delay control voltage $V_{CTL}$.

The delay time of the delay circuit of FIG. 1 can be approximated as $T_D=R_{EFF}*C_{EFF}=(1/\sqrt{2*k*I_D})*C_{EFF}$. $R_{EFF}$ is the small signal resistance at the ends of the voltage swing ranges that is the inverse of the transconductance for one of the two conducting load transistors 4 or 5. $C_{EFF}$ is the total effective capacitance and includes the drain capacitance of transistors 2 and 6, the gate and drain capacitance of transistor 4, and the gate capacitance of the input transistor of a next subsequent delay stage of the ring oscillator. Limiting the effective capacitance, $C_{EFF}$, reduces power consumption and further can enable increased operation speed.

For a ring oscillator with N stages of the circuit shown in FIG. 1, the operating frequency f1 of the ring oscillator will be:

$$f1=1/(2*N*T_D)=\sqrt{2}*k*I_D/(2*N*C_{EFF})$$

Accordingly, the ring oscillator using the circuit shown in FIG. 1 has the output voltage swing changing with $\sqrt{I_D}$ and an operating frequency f1 proportional to $\sqrt{I_D}$. Variations of the output voltage swing with $\sqrt{I_D}$ is an undesirable feature because such variation decreases power supply and substrate noise rejection over the whole operating frequency range. Further, the tuning range of the operating frequency f1 is controlled by limitations on the tail current $I_D$ according to the square root function.

SUMMARY OF THE INVENTION

In accordance with the present invention, an improved delay circuit for a VCO or ICO with a constant output swing, a wide tuning range, a high operation speed and low power consumption relative to the circuit of FIG. 1 is provided.

In accordance with the present invention, referring to FIG. 2, a delay circuit is provided which may be used in a ring oscillator of a VCO or ICO. The delay circuit includes a differential pair of NMOS transistors 102 and 103 with an NMOS transistor 101 providing the tail current for the differential pair. Complementary NMOS and PMOS load transistors 104, 106 and 105, 107 provide loads for the differential transistors 102 and 103. Transistors 111–114 and 121–122 together with an amplifier 130 provide biasing for the delay adjustment circuitry.

The amplifier 130 has a non-inverting (+) input set to $V_{DD}-V_{CLAMP}$, and W/L ratios of the transistors of the delay circuit are set so that either transistors 101, 102, 104 and 106, or 101, 103, 105 and 107 replicate the biasing transistors 111, 112, 113 and 114 respectively. As configured, a constant output voltage swing from $V_{DD}$ to $V_{DD}-V_{CLAMP}$ is provided at the outputs $V_{OUT}+$ and $V_{OUT}-$ of the delay device. Since $V_{CLAMP}$ is independent of the control voltage $V_{CTL}$ which controls the bias tail current from transistor 101, the output voltage swing of the time delay circuit will be constant for different tail currents as controlled by $V_{CTL}$. The constant output voltage swing enables the delay circuit to provide better noise rejection relative to the circuit of FIG. 1 over variations of operating current.

For the circuit of FIG. 2, the NMOS load transistors 104 or 105 contribute less to the effective capacitance $C_{EFF}$ which affects the operating frequency of a ring oscillator, whereas the PMOS transistors 4 or 5 of FIG. 1 do, so the circuit of FIG. 2 can obtain a higher operation speed without consuming more supply current. In addition, the frequency tuning range of a ring oscillator using the circuit of FIG. 2 can be made wider than that of the circuit of FIG. 1 because the operating frequency for a ring oscillator using the circuit of FIG. 2 is proportional to the tail current whereas the operating frequency using the device of FIG. 1 is proportional to the square root of the tail current.

BRIEF DESCRIPTION OF THE DRAWINGS

The present invention will be described with respect to particular embodiments thereof, and references will be made to the drawings in which.

DETAILED DESCRIPTION

Figure 2:
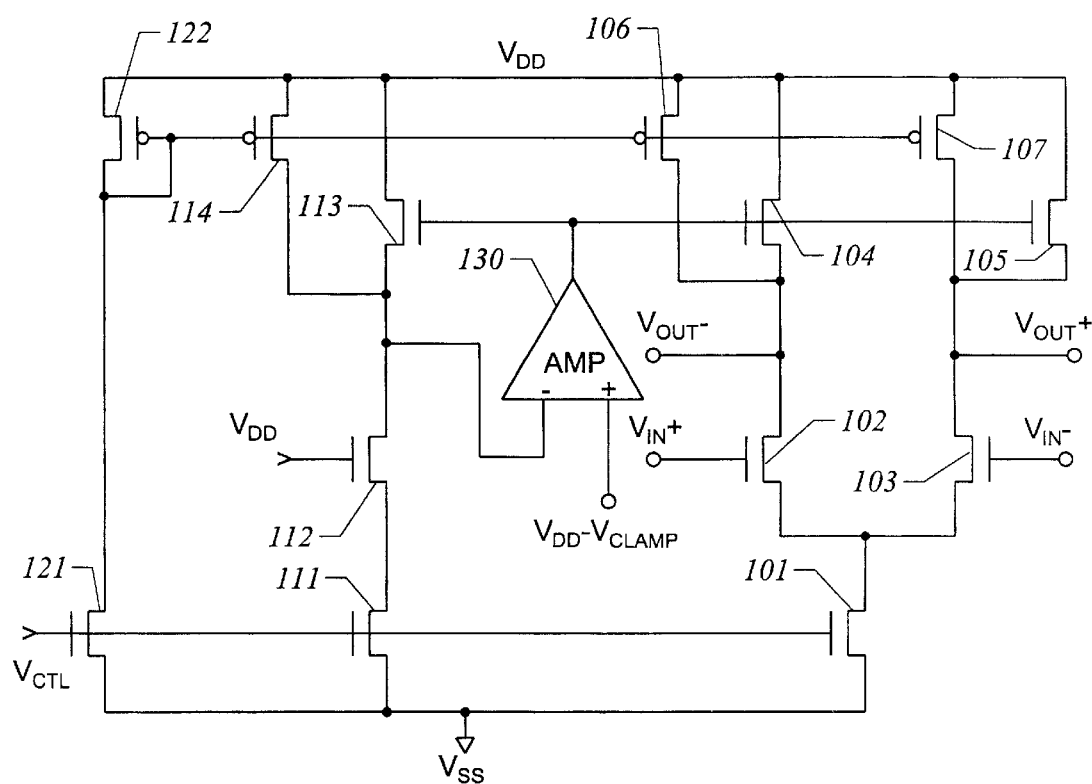
FIG. 2 shows a delay circuit for a ring oscillator in accordance with the present invention.

FIG. 2 shows an improved delay circuit for use in a ring oscillator of a VCO or an ICO in accordance with the present invention. The circuit includes an NMOS transistor 101 providing the tail current for the differential pair of NMOS transistors 102 and 103. An NMOS transistor 104 and a PMOS transistor 106 form a complementary load for transistor 102 of the differential pair. Similarly, an NMOS transistor 105 and a PMOS transistor 106 form a complementary load for the transistor 103 of the differential pair. Transistors 111–114 and 121–122 together with the amplifier 130 shown in FIG. 2 provide proper biasing for the delay device.

Figure 1:
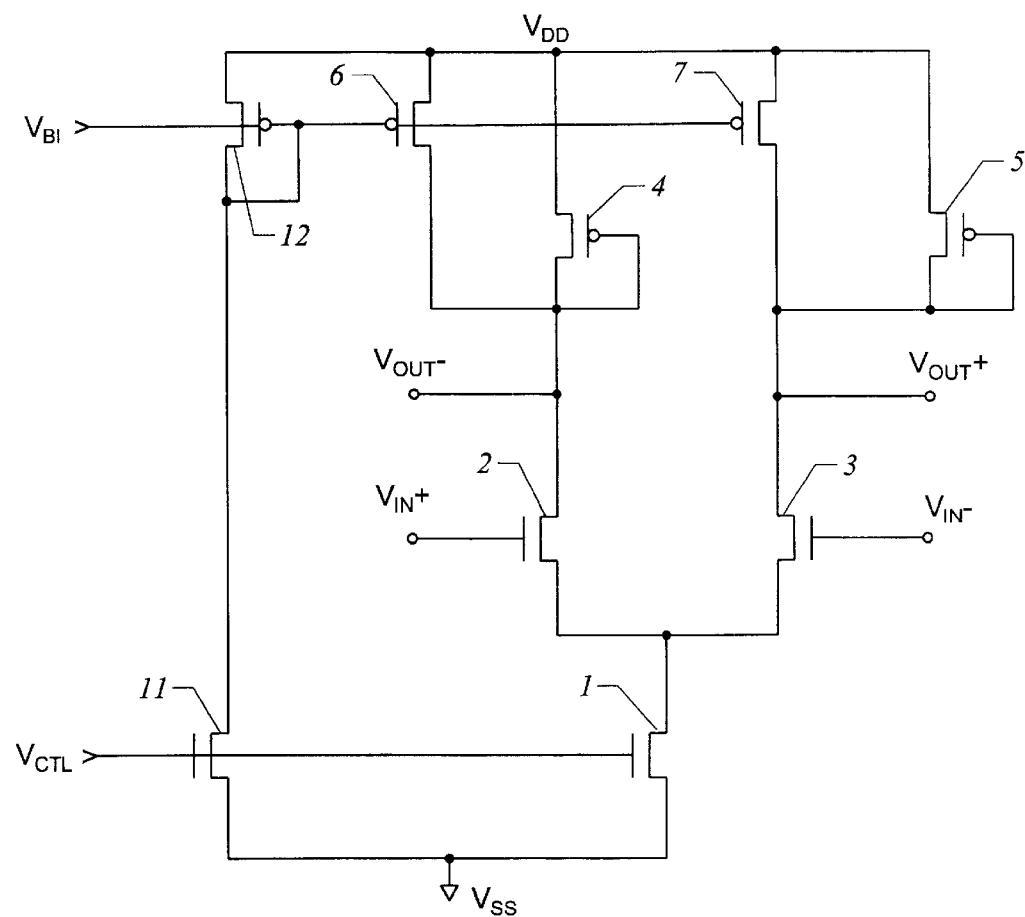
FIG. 1 shows a conventional delay circuit for a ring oscillator.

The gate bias of transistors 106 and 107 follows the same considerations as the bias of transistors 6 and 7 of FIG. 1. In one example for biasing, the W/L ratio of transistors 106, 107, 114 and 122 are set equal. Further, the W/L ratio of transistors 104, 105 and 113 are set equal, and the W/L ratio of transistors 102, 103 and 112 are set equal. Further, the W/L ratios of transistor 101 is set to two times the W/L ratio of transistors 111 and 121. Finally, the W/L ratios of transistors 104 and 105 are set at ⅓ of the W/L ratio of transistors 106 and 107.

The circuit of FIG. 2 provides several advantages when used in a VCO or ICO over the circuit of FIG. 1. The advantages are described in subsequent paragraphs.

First, the delay circuit of FIG. 2 has a constant output voltage swing from $V_{DD}$ to $V_{DD}-V_{CLAMP}$. When $V_{IN}+$ is high and $V_{IN}-$ is low, for example, $V_{OUT}-$ will be clamped to be $V_{DD}-V_{CLAMP}$ because transistors 101, 102, 104 and 106 replicate the biasing of transistors 111, 112, 113 and 114, respectively. At the same time, $V_{OUT}+$ will be $V_{DD}$ because transistor 107 will charge the output node until transistor 107 becomes cutoff. For the same reason, if $V_{IN}+$ is low and $V_{IN}-$ is high, $V_{OUT}-$ will be at $V_{DD}$ and $V_{OUT}+$ will be at $V_{DD}-V_{CLAMP}$. Since $V_{CLAMP}$ is independent of the control voltage $V_{CTL}$ which controls the bias tail current from transistor 101, the output voltage swing of the time delay circuit of FIG. 2 is constant for the different tail currents as controlled by $V_{CTL}$. Compared with the circuit in FIG. 1, the circuit having the constant output voltage swing in FIG. 2 enables a differential-to-single-ended converter to be designed more easily and can be used to make an oscillator with a better power supply and substrate noise rejection over a complete tuning range.

Further, the time delay of the circuit of FIG. 2 is approximately, $T_D=R_{EFF}*C_{EFF}=C_{EFF}*V/I$, where I is a half of the tail current of transistor 101 as controlled by control voltage $V_{CTL}$ and V is the same as the clamping voltage $V_{CLAMP}$. $C_{EFF}$ is the total parasitic capacitance at the drains of transistors 103 and 107, the source capacitance of transistor 105, and the gate capacitance of an input transistor of the next stage. For an oscillator with N stages of the circuit of FIG. 2, the circuit will have an operating frequency f2 expressed as follows:

$$f2=1/(2*N*T_D)=I/(2*N*C_{EFF}*V)$$

Since the size of NMOS transistor 104 in FIG. 2 is one third of that of PMOS transistor 4 in FIG. 1, and NMOS transistor 104 does not contribute to the gate to substrate capacitance $C_{GB}$ to $C_{EFF}$ whereas PMOS transistor 4 does, $C_{EFF}$ for the circuit of FIG. 2 is significantly less than $C_{EFF}$ for the circuit shown in FIG. 1. Therefore, the circuit of FIG. 2 can obtain a higher operation speed without consuming more supply current. In addition, the frequency tuning range of the circuit of FIG. 2 should be wider than that of the previous circuit because the operating frequency of a ring oscillator using the circuit of FIG. 2 is proportional to the tail current $I_D$ whereas the operating frequency of a ring oscillator using the circuit of FIG. 1 will be proportional to the square root of the tail current $I_D$.

Although the present invention has been described above with particularity, this was merely to teach one of ordinary skill in the art how to make and use the invention. Many other modifications will fall within the scope of the invention, as that scope is defined by the claims provided below.

What is claimed is:

1. A delay circuit for an oscillator comprising:
   a differential pair of transistors (102,103) connected in a common source configuration with gates of first and second transistors of the differential pair forming complementary inputs to the delay circuit, and drains of the first and second transistors of the differential pair forming complementary outputs of the delay circuit;
   a first load comprising third and fourth transistors (104, 106) having source-drain paths connected in parallel to couple a first voltage supply ($V_{DD}$) to the drain of the first transistor (102) of the differential pair;
   a second load comprising fifth and sixth transistors (105, 107) having source-drain paths connected in parallel to couple the first voltage supply ($V_{DD}$) to the drain of the second transistor (103) of the differential pair; and
   a bias circuit comprising:
      an amplifier (130) having a first input connected to a voltage reference, a second input and an output;
      a third load comprising seventh and eighth transistors (113,114) having source drain paths coupled between the first voltage supply ($V_{DD}$) and the second input of the amplifier, wherein gates of the third, fifth and seventh transistors are coupled to the output of the amplifier.

2. The delay circuit of claim 1 further comprising:
   a ninth transistor (122) having a source coupled to the first voltage supply ($V_{DD}$) and a drain and gate coupled together and to the gates of the fourth, sixth and eight transistors.

3. The delay circuit of claim 2 further comprising:
   a tenth transistor (101) having a drain coupled to the common sources of the first and second transistors (102,103) of the differential pair and a source coupled to a second voltage supply ($V_{ss}$), and having a gate coupled to a delay control voltage input ($V_{CTL}$); and
   an eleventh transistor (121) having a drain coupled to the drain of the ninth transistor (122), a source coupled to the second voltage supply ($V_{ss}$) and a gate coupled to the delay control voltage input ($V_{CTL}$) and the gate of the tenth transistor (101).

4. The delay control transistor of claim 3 further comprising:
   a twelfth transistor (112) having a drain coupled to the second input of the amplifier, a gate coupled to the first voltage supply ($V_{DD}$), and having a source; and
   a thirteenth transistor (111) having a drain coupled to the source of the twelfth transistor (112) a source coupled to the second voltage supply ($V_{ss}$), and a gate coupled to the delay control voltage and the gates of the tenth and eleventh transistors (101,121).

5. A delay circuit for an oscillator comprising:
   a differential pair of transistors comprising:
      a first NMOS transistor (102) having a gate forming a noninverting input ($V_{IN}+$) to the delay circuit, a drain forming an inverting output ($V_{OUT}-$) of the delay circuit, and having a source; and
      a second NMOS transistor (103) having a gate forming an inverting input ($V_{IN}-$) of the delay circuit, a drain forming a noninverting output ($V_{OUT}+$) of the delay circuit, and having a source coupled to the source of the first transistor of the differential pair;

a first load comprising:
  a third NMOS transistor (105) having a drain coupled to a first voltage supply ($V_{DD}$), a source coupled to the noninverting output ($V_{OUT}+$), and having a gate; and
  a first PMOS transistor (107) having a source coupled to the first voltage supply ($V_{DD}$), a drain coupled to the noninverting output ($V_{OUT}+$), and having a gate;

a second load comprising:
  a fourth NMOS transistor (104) having a drain coupled to the first voltage supply ($V_{DD}$), a source coupled to the inverting output ($V_{OUT}-$), and having a gate coupled to the gate of the third NMOS transistor (105); and
  and a second PMOS transistor (106) having a source coupled to the first voltage supply ($V_{DD}$), a drain coupled to the inverting output ($V_{OUT}-$), and having a gate coupled to the gate of the first PMOS transistor (107);

a fifth NMOS transistor (101) having a drain coupled to the sources of the first and second transistors, a source connected to a second voltage supply ($V_{ss}$), and having a gate; and a bias circuit comprising:
  an amplifier (130) having a;noninverting input connected to a voltage reference, an inverting input and an output;
  a third load comprising:
    an sixth NMOS transistor (113) having a drain coupled to the first voltage supply ($V_{DD}$), a source coupled to the inverting input of the amplifier (130), and having a gate coupled to the gate of the third NMOS transistor (105); and
    a third PMOS transistor (114) having a source coupled to the first voltage supply ($V_{DD}$), a drain coupled to the inverting input of the amplifier (130), and having a gate coupled to the gate of the first PMOS transistor (107);
  a seventh NMOS transistor (112) having a drain coupled to the inverting input of the amplifier (130), a gate coupled to the first voltage supply ($V_{DD}$), and having a source;
  a eighth NMOS transistor (111) having a drain coupled to the source of the seventh NMOS transistor (112), a source coupled to the second voltage supply ($V_{ss}$), a gate coupled to the gate of the fifth NMOS transistor (101);
  a ninth NMOS transistor (121) having a source coupled to the second voltage supply ($V_{ss}$), a gate coupled to the gate of the fifth NMOS transistor (101) and to a delay control voltage input ($V_{CTL}$) of the delay circuit, and having a drain; and
  a fourth PMOS transistor (122) having a source coupled to the first voltage supply ($V_{DD}$), and a drain and gate coupled together to the drain of the ninth NMOS transistor (121) and to the gate of the first PMOS transistor (107).

6. The delay circuit of claim 5,
wherein a width-to-length (W/L) ratio of each of the first, second, third, and fourth PMOS transistors (107, 106, 114, 122) are equal,
wherein a W/L ratio of each of the third, fourth, and sixth NMOS transistors (105, 104, 113) are equal,
wherein a W/L ratio of each of the first, second, and seventh NMOS transistors (102, 103, 112) are equal,
wherein a W/L ratio of the fifth NMOS transistor (101) is equal to two times the W/L ratio of each of the eighth and ninth NMOS transistors (111, 121), and
wherein the W/L ratio of each of the third and fourth NMOS transistors (104, 105) is equal to one third of the W/L of each of the first and second PMOS transistors (107, 106).

7. A delay circuit for an oscillator comprising:
a differential pair of NMOS transistors (102,103) connected in a common source configuration with gates of first and second NMOS transistors of the differential pair forming complementary inputs to the delay circuit, and drains of the first and second NMOS transistors of the differential pair forming complementary outputs of the delay circuit;

a first load comprising a first PMOS transistor (106) and a third NMOS transistor (104) having source-drain paths connected in parallel to couple a first voltage supply ($V_{DD}$) to the drain of the first NMOS transistor (102) of the differential pair;

a second load comprising a second PMOS transistor(107) and a fourth NMOS transistor (105) having source-drain paths connected in parallel to couple the first voltage supply ($V_{DD}$) to the drain of the second transistor of the differential pair; and a voltage bias circuit providing bias voltages to the gates of the first PMOS transistor (106) and the third NMOS transistor (104) of the first load, and to the second PMOS transistor (107) and fourth NMOS transistor (105) of the second load.

8. A delay circuit for an oscillator comprising:
a differential pair of transistors (102,103) connected in a common source configuration with gates of first and second transistors of the differential pair forming complementary inputs to the delay circuit, and drains of the first and second transistors of the differential pair forming complementary outputs from the delay circuit;

a first load comprising third and fourth transistors (104, 106) having source-drain paths connected in parallel to couple a first voltage supply ($V_{DD}$) to the drain of the first transistor (102) of the differential pair, wherein the third transistor (104) comprises an NMOS device, and the fourth transistor (106) comprises a PMOS device;

a second load comprising fifth and sixth transistors (105, 107) having source-drain paths connected in parallel to couple the first voltage supply ($V_{DD}$) to the drain of the second transistor of the differential pair, wherein the fifth transistor (105) comprises an NMOS device, and the sixth transistor (107) comprises a PMOS device;

a tail current control transistor (101) having a source-drain path coupling the sources of the pair of differential transistors to a second voltage supply ($V_{ss}$), and having a gate for applying a control voltage to control a time delay provided by the delay circuit; and a voltage bias circuit providing bias voltages to the gates of the transistors of the first load and the second load so the time delay is linearly proportional to tail current provided from the source to drain of the tail current control transistor.

* * * * *